(12) United States Patent
Jungbauer et al.

(10) Patent No.: US 7,080,575 B2
(45) Date of Patent: Jul. 25, 2006

(54) MECHATRONIC TRANSMISSION CONTROL

(75) Inventors: Bernd Jungbauer, Regensburg (DE);
Christoph Lincke, Regensburg (DE);
Josef Loibl, Bad Abbach (DE); Georg Mentzel, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/655,505

(22) Filed: Sep. 4, 2003

(65) Prior Publication Data
US 2004/0045736 A1    Mar. 11, 2004

Related U.S. Application Data

(63) Continuation of application No. PCT/DE02/00505, filed on Feb. 12, 2002.

(30) Foreign Application Priority Data

Mar. 7, 2001    (DE) .................. 101 10 948

(51) Int. Cl.
*F16H 57/02* (2006.01)
(52) U.S. Cl. .................... 74/606 R
(58) Field of Classification Search ............. 477/131, 477/138; 475/127, 149, 114; 74/606 R
See application file for complete search history.

(56) References Cited

U.S. PATENT DOCUMENTS

| | | | | |
|---|---|---|---|---|
| 5,611,372 A * | 3/1997 | Bauer et al. | ............ | 74/606 R |
| 5,662,007 A * | 9/1997 | Starker et al. | ............ | 74/606 A |
| 5,709,134 A * | 1/1998 | Ulm | ............ | 74/606 R |
| 5,735,697 A * | 4/1998 | Muzslay | ............ | 439/83 |
| 5,749,060 A * | 5/1998 | Graf et al. | ............ | 74/606 R |
| 5,941,137 A * | 8/1999 | Beer et al. | ............ | 74/606 R |
| 6,028,770 A * | 2/2000 | Kerner et al. | ............ | 361/704 |
| 6,160,708 A * | 12/2000 | Loibl et al. | ............ | 361/704 |
| 6,180,880 B1 * | 1/2001 | Loibl et al. | ............ | 174/52.3 |
| 6,341,066 B1 * | 1/2002 | Murowaki et al. | ............ | 361/707 |
| 6,442,027 B1 * | 8/2002 | Sanada et al. | ............ | 361/704 |
| 6,494,088 B1 * | 12/2002 | Albert et al. | ............ | 73/118.1 |
| 6,570,773 B1 * | 5/2003 | Loibl et al. | ............ | 361/752 |
| 2002/0088304 A1 * | 7/2002 | Thorum et al. | ............ | 74/606 R |

FOREIGN PATENT DOCUMENTS

| | | |
|---|---|---|
| DE | 198 21 897 A1 | 11/1998 |
| DE | 197 51 095 C1 | 5/1999 |
| DE | 195 15 622 C2 | 6/2000 |
| DE | 198 60 716 C1 | 9/2000 |
| DE | 199 38 110 A1 | 2/2001 |
| JP | 410315797 A * | 12/1998 |

* cited by examiner

*Primary Examiner*—Roger Pang
(74) *Attorney, Agent, or Firm*—Baker Botts L.L.P.

(57) ABSTRACT

A mechatronic transmission control is disclosed. The control comprises a housing (2) that can be installed in a motor vehicle transmission, an electronic control unit (3), whose components (5) are arranged on a fixed board (4) in the housing (2), sensor components (8, 10, 11, 12, 14, 17 to 24), which are coupled to the electronic control unit (3) and a flexible printed circuit board (6), on which the sensor components (8, 10, 11, 12, 14, 17 to 24) are positioned and which acts as an electrical and mechanical connection element between the sensor components (8, 10, 11, 12, 14, 17 to 24) and the electronic control unit (3).

13 Claims, 1 Drawing Sheet

MECHATRONIC TRANSMISSION CONTROL

CROSS REFERENCE TO RELATED APPLICATION

This application is a continuation of copending International Application No. PCT/DE02/00505 filed Feb. 12, 2002 which designates the United States, and claims priority to German application number 10110948.2 filed Mar. 7, 2001.

TECHNICAL FIELD OF THE INVENTION

The invention relates to a mechatronic transmission control.

BACKGROUND OF THE INVENTION

As background of the invention it must be recorded that, for cost and quality reasons, so-called standalone transmission electronics for automatic transmissions in modern developments are directly integrated into the actual transmission. The unit produced in this way from mechanical components such as a plastic carrier including the actuators, hydraulic components and the necessary electromechanical connection elements upon these, and also sensor components that form the rotational speed, pressure, temperature, route sensors and the like, and from electronic components that usually form the actual electronic control unit on the basis of a ceramic substrate, is referred to in technical jargon as a mechatronic transmission control.

Conventional standalone transmission electronics are now usually located in the engine or passenger compartment. The sensors used here are integrated into a special housing that is positioned on the actual transmission. The electrical connection between the sensor system and transmission electronics is made by means of a cable and a plug-in connector.

The reliability of the electrical connection between the electronic control unit and its sensor components is problematical here. It must be guaranteed that the sensor components, including any possible electronic components present, such as those for signal processing are protected against environmental influences. Such influences take the form, for example, of mechanical stresses such as engine vibrations or thermal influences and environmental media such as dust, water or oil. Mounting location conditions such as those generally found in the transmission must also be taken into account, which often heightens the problem of reliability.

In the described prior art, in which the sensor element is electrically connected to the electronic control unit via a corresponding plug and cable or so-called pressed screens that are soldered to the terminal contact of the specific electronic sensor components or the plug, it is known that all the components mentioned for protection against environmental influences must be sealed into the housing by means of a sealing compound. The tight sealing of a connection cable or a nay possible pressed screen is also not without problems from a technical point of view.

Further disadvantages of the connection technology according to the prior art are that the complete arrangement of the sensor with housing, cable and corresponding plug-in connectors requires a lot of space. The plug-in connectors are also usually supplied with gaskets to protect the electrical contacts against environmental influences such as temperature stress, contamination and aggressive media. In order to protect the mechanically strong connection, snap connections or metal clamps are usually also provided in the area of the plug.

To summarize, determined by the requirements outlined above, mechanically costly and also cost-intensive designs for connecting the sensor system to the actual electronic control unit of mechatronic transmission controls are used in the prior art.

SUMMARY OF THE INVENTION

On this basis the object of the invention is to design a mechatronic transmission control in such a way that a reliable connection between the sensor system and the electronic control unit of the transmission control can be obtained in a more simple manner.

This object can be achieved by a flexible printed circuit board on which the sensor components are positioned that acts as an electrical and mechanical connection element between the sensor components and the electronic control unit.

Through this central idea of the invention it is possible to create a very reliable, simple and flexible connection between the sensor components and the electronic control unit. Because the electronic sensor components can be soldered directly onto the conductor tracks of the flexible printed circuit board, all the plug-in connectors, as are provided and needed for the prior art, can be omitted. As a result, very compact and especially low-profile designs for various sensors can be achieved. There is also considerable freedom in designing the sensor, that can be designed for the installation in a horizontal, vertical or inclined position because the flexible printed circuit board can in principle be bent at will. Therefore there is a completely free choice of mounting location where the sensor element and the possibly existing additional wiring are located. This has the advantage that the location of the transmission can be adapted to any given mechanical boundary conditions such as the fixed position of the sender wheels to be scanned or movable shafts.

In addition, the invention is also created for a simple-to implement gasket. What this means is that the known sealing compound is easier and more safely managed in combination with a flexible printed circuit board for the electrical and mechanical connection to the sensor components than with the prior art.

BRIEF DESCRIPTION OF THE DRAWINGS

Further features, details and advantageous forms of embodiment of the invention can be taken from the following description in which an embodiment is explained in greater detail based on the enclosed drawings. The drawings show.

DETAILED DESCRIPTION OF THE PREFERRED EMBODIMENTS

Figure 1:
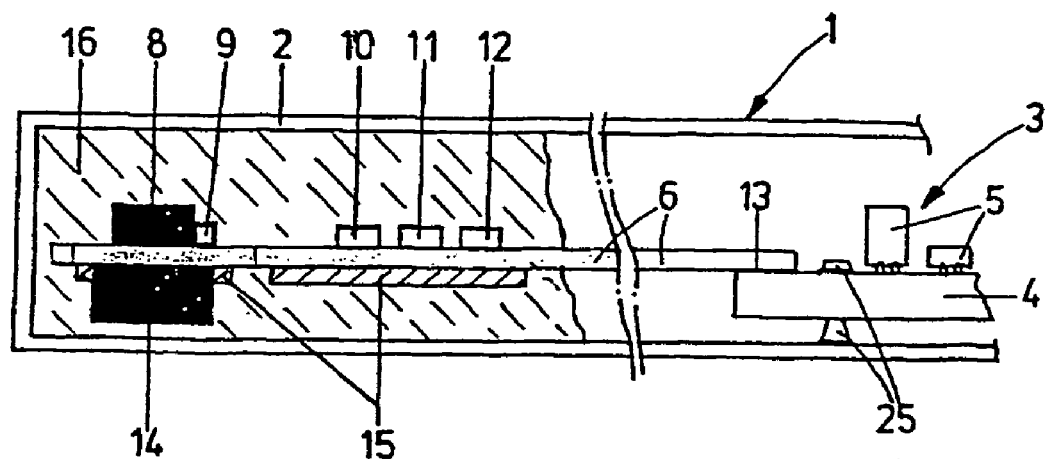
FIG. 1 a cross-sectional, schematic side view of a mechatronic transmission control, FIG. 2 a view from above of a flexible printed circuit board with sensor components and additional wiring of the transmission control according to FIG. 1, and FIG. 3 a schematic view from above of a position sensor that can be used in the transmission control.
Figure 2:
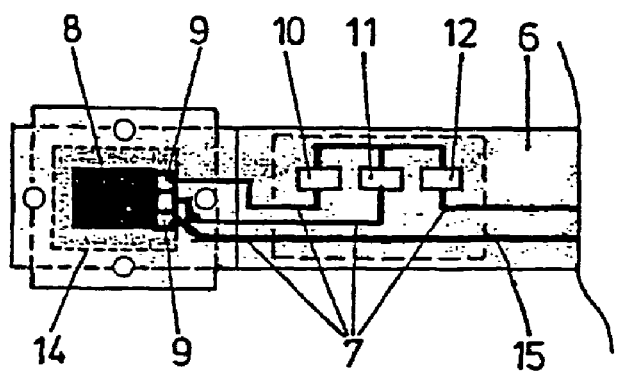

As is evident from FIG. 1 and FIG. 2, the mechatronic transmission control 1 is accommodated in a housing 2 that is directly flanged onto the transmission of a motor vehicle or integrated into the transmission in a manner not shown in greater detail. The main item of the transmission control 1 is an electronic control unit 3 on the fixed board 4 of which, based on a ceramic substrate for example, the individual electronic components 5 are mounted with conventional technology such as SMD technology. The board 4 is supported in housing 2 by means of suitable mechanical elements 25 as shown schematically in the diagram.

A flexible printed circuit board 6 is connected to board 4 in the form of an extended strip, in essence a rectangular strip viewed from above. This flexible printed circuit board 6, for example, consists of a flexible but durable electrical insulating foil on which conductor tracks 7 take care of the electrical connection of the electronic components 5 in the control unit 3 to the sensor components arranged on the flexible printed circuit board 6. These sensor components are actually an electronic sensor chip 8 located at the free end of the printed circuit board 6 in the form of an IC chip for which the connections 9 are also connected accordingly via the conductor paths 7 to additional wiring components 10, 11, 12 installed on the printed circuit board 6 in a manner appropriate to their switching purpose. The conductor track 7 leading to the board 4 is routed to the connecting point 13 shown only schematically in FIG. 1 in a suitable manner in a conductor track on the board 4. The printed circuit board 6 and the board 4 can, for example, be connected mechanically by glueing or ultrasound welding.

On the bottom of printed circuit board 6 on the other side to the sensor chip 8 and the wiring components 10, 11, 12, a magnet 14 is glued on as a passive auxiliary element that might typically be required if the sensor is designed as a Hall rpm sensor for example.

On the bottom of printed circuit board 6, there is also a plate-shaped support 15 glued on below the wiring components 10, 11, 12 that renders the printed circuit board 6 nonflexible in this area. This prevents any breaking off of the soldered-on wiring components 10, 11, 12 from the printed circuit board 6.

Finally, the printed circuit board 6 in the area of the end turned away from its board 4 is completely embedded, including the wiring components 10, 11, 12, the sensor chip 8 and the magnet 14 in housing 2, in a sealing compound 16, so that these components are sealed hermetically against environmental influences. Because of this additional sealing function, the entire arrangement can also be directly immersed and positioned in the transmission oil.

Sensor chip 8 and wiring components 10, 11, 12 can be attached to the flexible printed circuit board 6 by means of normal SMD soldering processes. If they are available as so-called "bare dies", such chips can also be bonded directly to the conductor tracks 7 of the flexible printed circuit board 6.

Figure 3:
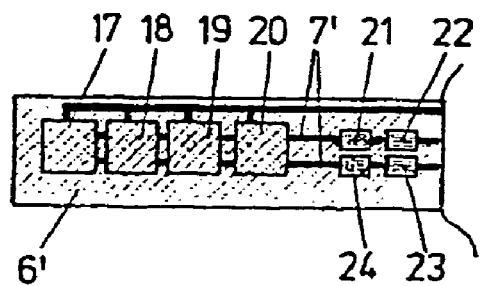

In order to illustrate the universal applicability of the design according to the invention, FIG. 3 shows an arrangement of the sensor components in the form of four path sensors 17, 18, 19, 20 connected in a linear arrangement to which corresponding additional wiring components 21, 22, 23, 24 are allocated for signal processing. The electrical connection in its turn is made via the conductor tracks 7' shown schematically located on the flexible printed circuit board 6'.

The invention claimed is:

1. A mechatronic transmission control comprising:
   a housing for installation in a motor vehicle transmission,
   an electronic control unit comprising components, said components arranged on a fixed board in the housing,
   mechanical components, and
   a sensor coupled to the electronic control unit,
   the sensor being directly fixed to a flexible circuit board on a first side thereof, said flexible board and said fixed board providing for an electrical connection between the sensor and the electronic control unit, wherein a portion of the flexible board is mechanically attached to a portion of the fixed board.

2. A transmission control according to claim 1, wherein the flexible printed circuit board with the sensor is embedded in a sealing compound.

3. A transmission control according to claim 1, wherein passive auxiliary elements and additional wiring components are arranged on said flexible circuit board.

4. A transmission control according to claim 1, wherein a mechanical support part is attached to a second side of the flexible printed circuit board.

5. A transmission control according to claim 1, wherein the sensor is connected electrically and mechanically to conductor paths of the flexible printed circuit board by means of an SMD soldering process or bonding.

6. A transmission control according to claim 3, wherein the passive auxiliary elements of the sensor are glued onto to the flexible printed circuit board.

7. A mechatronic transmission control comprising:
   a housing,
   an electronic control unit comprising a fixed board with components thereon,
   a flexible printed circuit board mechanically coupled to the fixed board, said flexible printed circuit board electrically coupled to the electronic control unit on which at least one sensor is directly fixed to the flexible printed circuit board on a first side thereof.

8. A transmission control according to claim 7, further comprising mechanical components for supporting the fixed board.

9. A transmission control according to claim 7, wherein the flexible printed circuit board with the sensor is embedded in a sealing compound.

10. A transmission control according to claim 7, wherein the flexible printed circuit board further comprises passive auxiliary elements and additional wiring components.

11. A transmission control according to claim 7, wherein a mechanical support part is attached to a second side of the flexible printed circuit board.

12. A transmission control according to claim 7, wherein the at least one sensor is connected electrically and mechanically to conductor paths of the flexible printed circuit board by means of an SMD soldering process or bonding.

13. A transmission control according to claim 10, wherein the passive auxiliary elements of the at least one sensor are glued onto to the flexible printed circuit board.

* * * * *